United States Patent
Park et al.

(10) Patent No.: US 12,518,978 B2
(45) Date of Patent: Jan. 6, 2026

(54) PRESSURE ADJUSTMENT APPARATUS FOR CONTROLLING PRESSURE IN CHAMBER AND SUBSTRATE PROCESSING APPARATUS INCLUDING THE SAME

(71) Applicant: SEMES CO., LTD., Cheonan-si (KR)

(72) Inventors: Su Chul Park, Cheonan-si (KR); Eui Cheol Hong, Cheonan-si (KR); Min Cheol Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 848 days.

(21) Appl. No.: 17/562,986

(22) Filed: Dec. 27, 2021

(65) Prior Publication Data

US 2022/0208562 A1 Jun. 30, 2022

(30) Foreign Application Priority Data

Dec. 29, 2020 (KR) .......................... 10-2020-0185935

(51) Int. Cl.
*H01L 21/67* (2006.01)
*H01J 37/32* (2006.01)

(52) U.S. Cl.
CPC .. *H01L 21/67017* (2013.01); *H01J 37/32449* (2013.01); *H01J 37/32834* (2013.01)

(58) Field of Classification Search
None
See application file for complete search history.

(56) References Cited

U.S. PATENT DOCUMENTS

| | | | |
|---|---|---|---|
| 6,544,585 B1* | 4/2003 | Kuriyama | H01L 21/6715 438/678 |
| 8,430,962 B2 | 4/2013 | Masuda | |
| 10,287,682 B2 | 5/2019 | Kikuchi et al. | |
| 2005/0051194 A1* | 3/2005 | Sakashita | B08B 7/0021 134/21 |
| 2006/0175012 A1* | 8/2006 | Lee | C23C 16/4486 438/758 |

(Continued)

FOREIGN PATENT DOCUMENTS

| KR | 10-0697280 | 8/2006 |
|---|---|---|
| KR | 10-2011-0012743 | 2/2011 |

(Continued)

OTHER PUBLICATIONS

Office Action from the Taiwan Intellectual Property Office dated Jul. 6, 2022.

*Primary Examiner* — Parviz Hassanzadeh
*Assistant Examiner* — Margaret Klunk (57) ABSTRACT

A pressure adjustment apparatus includes a storage tank storing a gas for the chamber with an outlet, a first supply line supplying the gas from an external line to the storage tank, a second supply line supplying the gas from the storage tank to the chamber, a discharge line discharging the gas from the chamber using the outlet of the chamber, and a controller controlling valves at the first, second, and discharge lines. The discharge line includes first and second valves connected to each other in parallel at an end portion of the outlet of the chamber, and a third valve connected to the end portion of the outlet of the chamber. The controller opens the first and second valves to discharge the gas from the chamber, and opens the third valve after a predetermined amount of time after the opening of the first and second valves.

5 Claims, 7 Drawing Sheets

(56) References Cited

U.S. PATENT DOCUMENTS

| | | | |
|---|---|---|---|
| 2006/0243207 A1* | 11/2006 | Jursich | C23C 16/45512 427/248.1 |
| 2010/0300357 A1* | 12/2010 | Yamamoto | C23C 16/45578 257/E21.482 |
| 2012/0304485 A1* | 12/2012 | Hayashi | H01L 21/02057 257/E21.328 |
| 2013/0287615 A1* | 10/2013 | Fong | F04B 3/00 417/523 |
| 2015/0303036 A1* | 10/2015 | Jeong | H01J 37/32513 118/733 |
| 2016/0218026 A1* | 7/2016 | Kobayashi | H01L 21/67017 |
| 2017/0122496 A1 | 5/2017 | Scannell | |
| 2018/0096863 A1* | 4/2018 | Goshi | H01L 21/02057 |
| 2018/0264504 A1* | 9/2018 | Egashira | H01L 21/02101 |
| 2021/0217647 A1 | 7/2021 | Nabeya et al. | |

FOREIGN PATENT DOCUMENTS

| | | |
|---|---|---|
| KR | 10-2017-0113154 | 10/2017 |
| KR | 10-2019-0003107 | 1/2019 |
| WO | 99-29439 | 6/1999 |

\* cited by examiner

PRESSURE ADJUSTMENT APPARATUS FOR CONTROLLING PRESSURE IN CHAMBER AND SUBSTRATE PROCESSING APPARATUS INCLUDING THE SAME

CROSS REFERENCE TO RELATED APPLICATION

The present application claims priority to Korean Patent Application No. 10-2020-0185935, filed Dec. 29, 2020, the entire contents of which is incorporated herein for all purposes by this reference.

BACKGROUND OF THE INVENTION

Field of the Invention

The present disclosure relates to a pressure adjustment apparatus and, more particularly, to a pressure adjustment apparatus configured to control pressure in a chamber and a substrate processing apparatus including the same.

Description of the Related Art

A semiconductor (or display) manufacturing process is a process for manufacturing a semiconductor device on a substrate (e.g., wafer). For example, the semiconductor manufacturing process includes processes of exposure, deposition, etching, ion implantation, cleaning, and the like. The semiconductor manufacturing process may include a process for processing a substrate using high pressure gas.

In a process using high pressure gas, a system in which gas is quickly supplied into the chamber for a faster process and then the gas in the chamber is discharged when the process is completed is required. A control method for forming and maintaining an appropriate level of air pressure in the chamber for each process is required.

Moreover, in the process in which the gas is supplied into the chamber or discharged from the chamber, an impact may be applied to the chamber and lines, so that the life of the substrate processing apparatus may be reduced. Therefore, when the gas is supplied to the chamber or is discharged from the chamber, a method for minimizing an impact applied to the chamber and lines is required.

SUMMARY OF THE INVENTION

Accordingly, the present disclosure has been made keeping in mind the above problems occurring in the related art, and the present disclosure is intended to provide a pressure adjustment apparatus and a substrate processing apparatus including the same, the pressure adjustment apparatus being configured to rapidly supply gas into a chamber and to discharge the gas from the chamber.

Another objective of the present disclosure is intended to provide a pressure adjustment apparatus and a substrate processing apparatus including the same, the pressure adjustment apparatus being configured to generate and maintain appropriate air pressure suitable in a chamber.

A further objective of the present disclosure is intended to provide a pressure adjustment apparatus and a substrate processing apparatus including the same, the pressure adjustment apparatus being configured to minimize an impact applied to a chamber and lines during supplying and discharging the gas.

The problem to be solved is not limited thereto, and other problems not mentioned will be clearly understood by those skilled in the art from the subsequent description.

According to an embodiment of the present invention, a pressure adjustment apparatus for controlling a pressure in a chamber of semiconductor manufacturing equipment includes a storage tank configured to store a gas to be supplied to the chamber with an outlet, a first supply line configured to supply the gas from an external line to the storage tank, a second supply line configured to supply the gas from the storage tank to the chamber, a discharge line configured to discharge the gas from the chamber to using the outlet of the chamber, and a controller configured to control a plurality of valves provided at the first supply line, the second supply line, and the discharge line. The discharge line includes a first valve and a second valve connected to each other in parallel at an end portion of the outlet of the chamber, and a third valve connected to the end portion of the outlet of the chamber. The controller is configured to open the first valve and the second valve to discharge the gas from the chamber, and open the third valve after a predetermined amount of time after opening of the first valve and the second valve.

According to an embodiment of the present invention, a pressure adjustment apparatus for controlling a pressure in a chamber of semiconductor manufacturing equipment includes a supply line configured to supply a gas from an external line to the chamber, a discharge line configured to discharge the gas from the chamber to an outlet, and a controller configured to control a plurality of valves provided at the supply line and the discharge line. The discharge line includes a first valve and a second valve connected to each other in parallel at an end portion of an outlet of the chamber, and a third valve connected to the end portion of the outlet of the chamber. The controller is configured to open the first valve and the second valve to discharge the gas from the chamber, and open the third valve after a predetermined time after opening of the first valve and the second valve.

According to an embodiment of the present invention, a substrate processing apparatus includes a chamber providing a space in which substrate processing is performed using a high pressure gas, a storage tank configured to store the gas to be supplied to the chamber, a first supply line configured to supply the gas from an external line to the storage tank, a second supply line configured to supply the gas from the storage tank to the chamber, a discharge line configured to discharge the gas from the chamber to an outlet, and a controller configured to control a plurality of valves provided at the first supply line, the second supply line, and the discharge line. The discharge line comprises a first valve and a second valve connected to each other in parallel at an end portion of an outlet of the chamber, and a third valve connected to the end portion of the outlet of the chamber. The controller is configured to open the first valve and the second valve when a process in the chamber is completed, and open the third valve after a predetermined time after the opening of the first valve and the second valve.

BRIEF DESCRIPTION OF THE DRAWINGS

The above and other objectives, features, and other advantages of the present disclosure will be more clearly understood from the subsequent detailed description when taken in conjunction with the accompanying drawings, in which.

DETAILED DESCRIPTION OF THE INVENTION

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the subsequent description, if it is decided that the detailed description of known function or configuration related to the present disclosure makes the subject matter of the present disclosure unclear, the detailed description is omitted, and the same reference numerals will be used throughout the drawings to refer to the elements or parts with a same or similar function or operation.

Furthermore, in various embodiments, elements with the same configuration will be described in a representative embodiment by using the same reference numeral, and different configurations from the representative embodiment will be described in other embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words, such as "between" versus "directly between", "adjacent" versus "directly adjacent", etc., used to describe the relationship between elements should be interpreted in a like fashion. It will be further understood that the terms "comprises", "comprising", includes, and/or including, when used herein, specify the presence of stated features, integers, steps, operations, elements, and/or components, but do not preclude the presence or addition of one or more other features, integers, steps, operations, elements, components, and/or groups thereof.

In the flowing description, unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
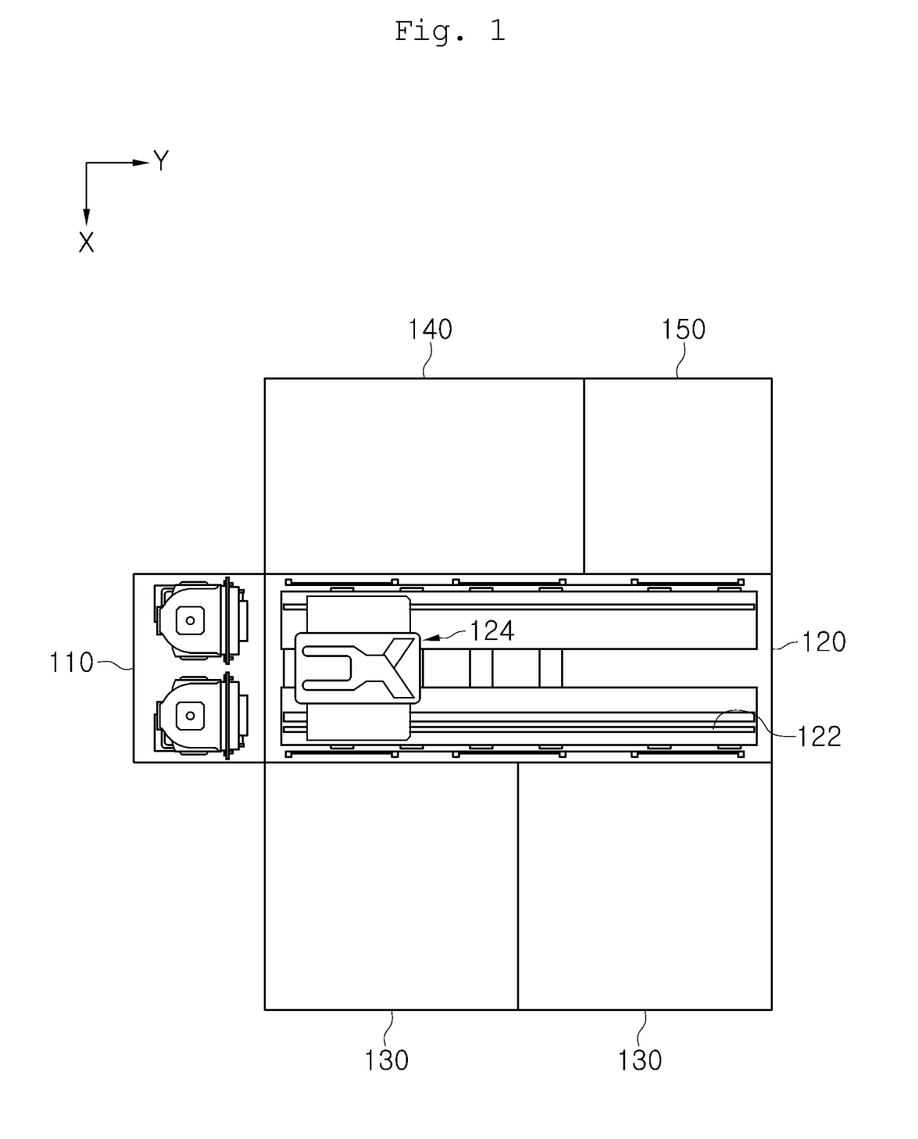
FIG. 1 is a view showing a schematic structure of substrate processing equipment.

FIG. 1 is a view showing a schematic structure of substrate processing equipment. The substrate processing equipment according to an embodiment of the present disclosure may be equipment performing a process for a substrate W using high pressure gas. For example, the substrate processing equipment may perform a function of bonding a plurality of chips that are temporarily bonded on the substrate W to the substrate W using high temperature and high pressure gas.

Referring to FIG. 1, bonding equipment includes a loading part 110, a substrate transfer part 120, a substrate processing part 130, and a substrate inspection part 140. The loading part 110 is configured such that a container accommodating the substrate W load the plurality of chips thereon is seated. The substrate transfer part 120 takes the substrate out of the container seated on the loading part 110. The substrate processing part 130 processes the substrate W provided from the substrate transfer part 120. The substrate inspection part 140 receives the substrate W processed by the substrate processing part 130 from the substrate transfer part 120 and inspects the chips bonded on the processed substrate W.

The loading part 110 is an interface for loading the substrate W to the bonding equipment or removing the processed substrate W. The loading part 110 may be referred as a rod port. The loading part 110 receives the container storing the substrate W therein. A port of the loading part 110 on which the container is seated may include a plurality of ports. The ports may be arranged in a predetermined direction. As an example of the container receiving the substrate W, a front opening unified pod (FOUP) may be used.

The substrate transfer part 120 is a device that transfers the substrate W in the bonding equipment. The substrate transfer part 120 may include a substrate transfer robot 124 and a movement guide 122. The substrate transfer robot 124 may grip and transfer the substrate W. The movement guide 122 may provide a route for movement of the substrate transfer robot 124. The movement guide 122 may be arranged along a predetermined direction. The substrate transfer robot 124 may be provided on the movement guide 122. The substrate transfer robot 124 may be moved in a direction of the movement guide 122.

The substrate processing part 130 may perform a processing for the substrate W provided from the substrate transfer part 120. The substrate processing part 130 may include a plurality of processing parts 130 in horizontal and vertical directions.

The substrate inspection part 140 may inspect whether the chips on the substrate W are normally bonded on preset locations. The substrate inspection part 140 may include a vision unit (camera) for capturing images of the chips on the substrate W and performing an inspection for the chips.

Figure 2:
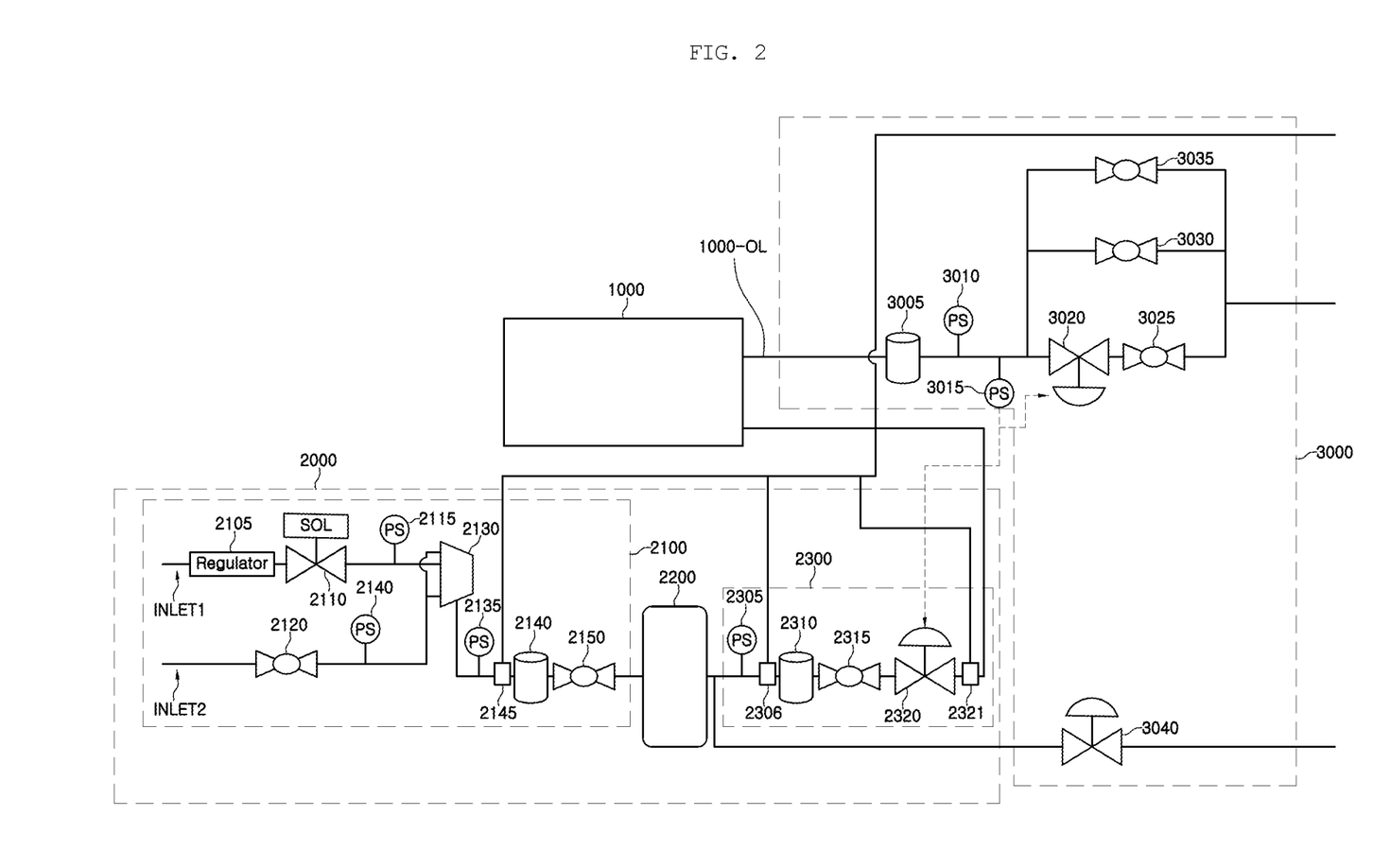
FIG. 2 is a view showing a structure of a pressure adjustment apparatus according to an embodiment of the present disclosure.

FIG. 2 is a view showing a structure of a pressure adjustment apparatus according to an embodiment of the present disclosure. The pressure adjustment apparatus provided for controlling pressure in a chamber 1000 in the semiconductor manufacturing equipment includes a supply line 2000, a discharge line 3000, and a controller. The supply line 2000 supplies gas from an external line to the chamber 1000, the discharge line 3000 discharges the gas from the chamber 1000 using an outlet 1000-OL of the chamber 1000, and the controller controls valves provided in the supply line 2000 and the discharge line. In some embodiment, the outlet 1000-OL may be part of the discharge line 3000. For example, various valves of the discharge cline 300 may be connected to the outlet 1000-OL extending from the chamber 1000.

The supply line 2000 includes a storage tank 2200, a first supply line 2100, and a second supply line 2300. The storage tank 2200 stores the gas to be supplied to the chamber 1000, the first supply line 2100 supplies the gas from the external line to the storage tank 2200, and the second supply line 2300 supplies the gas from the storage tank 2200 to the chamber 1000.

The first supply line 2100 includes a first inlet INLET1, a second inlet INLET2, and a booster 2130. The gas flows into the first inlet INLET1, the second inlet INLET2 is formed as a separate line from the first inlet INLET1 and the gas flows thereinto, and the booster 2130 amplifies the gas flowing into the first inlet INLET1 and the second inlet INLET2 to a predetermined pressure and discharges the amplified gas.

The booster 2130 may output the gas flowing through the first inlet INLET1 at high pressure by using the pressure of the gas flowing through the second inlet INLET2 for a first time section. The booster 2130 may output the gas flowing through the second inlet INLET2 at high pressure by using the pressure of the gas flowing through the first inlet INLET1 for a second time section. The booster having the two inlets and two compressors is configured to repeatedly perform an operation of using the gas flowing through a first side of the booster and outputting the amplified gas at the opposite side.

The gas supplied through the first inlet INLET1 flows through a regulator 2105 maintaining a predetermined amount of air pressure and a solenoid valve 2110 of which opening and closing are controlled. A pressure sensor 2115 provided for measuring the pressure of the gas flowing through the first inlet INLET1 may be provided in front of an input end of the booster 2130. An opening and closing valve 2120 controlling a flow state of the gas supplied through the second inlet INLET2 and the pressure sensor 2115 measuring the pressure of the gas supplied through the second inlet INLET2 may be provided in front of an input end of the booster 2130.

The gas output by the booster 2130 may be supplied to the storage tank 2200 by passing through a pressure sensor 2135, a relief valve 2140, a filter 2145, and an opening and closing valve 2150. In order to secure the safety of a relevant line, the relief valve 2140 may discharge the gas to another location (external location) when the pressure of the gas is equal to or higher than a reference value.

The storage tank 2200 is set to store the gas at a pressure higher than the pressure in the chamber 1000.

The second supply line 2300 includes a first flow rate adjustment valve 2320 of which an opening and closing ratio is controlled in response to the pressure in the chamber 1000. The second supply line 2300 may include a pressure sensor 2305, a relief valve 2306, a filter 2310, and an opening and closing valve 2315. The pressure sensor 2305 may measure the pressure of the gas discharged from the storage tank 2200 to the chamber 1000, the relief valve 2306 may discharge the gas to the outside when the pressure equal to or higher than the reference value is generated, the filter 2310 may separate a foreign substance from the gas discharged from the storage tank 2200 to the chamber 1000, and the opening and closing valve 2315 may control whether the gas is discharged from the storage tank 2200 to the chamber 1000. A relief valve 2321 may be provided between the first flow rate adjustment valve 2320 and the chamber 1000 to discharge the gas to the outside when the pressure equal to or higher than the reference value is generated. A manual opening and closing valve 3040 may be provided to discharge the gas from the storage tank 2200 to the outside.

The discharge line 3000 includes a first opening and closing valve 3025, a second opening and closing valve 3030, and a third opening and closing valve 3035. In some embodiments, the discharge line 3000 may further include a portion of the outlet 1000-OL of the chamber 10000. For example, the first to third opening and closing valves 3025, 3030 and 3035 may be connected to the portion of the outlet 1000-OL. The first opening and closing valve 3025 and the second opening and closing valve 3030 are connected to each other in parallel at an outlet end (i.e., an end portion of the outlet 1000-OL) of the chamber 1000, and the third opening and closing valve 3035 is connected to the outlet end of the chamber 1000. In some embodiments, the first to third opening and closing valves 3025, 3030 and 3035 may be connected in parallel with each other at the outlet end of the chamber 1000. The controller opens the first opening and closing valve 3025 and the second opening and closing valve 3030 when the gas is discharged from the chamber 1000. After a predetermined amount of time after opening of the first opening and closing valve 3025 and the second opening and closing valve 3030, the controller opens the third opening and closing valve 3035. The controller may control the first opening and closing valve 3025, the second opening and closing valve 3030, and the third opening and closing valve 3035 individually so as to sequentially discharge the gas in from the chamber 1000, instead of discharging the gas at once which may lead to damage to components (e.g., lines and valves).

According to the embodiment of the present disclosure, when the gas is discharged from the chamber 1000, an impact generated to the chamber 1000 and lines may be minimized by sequentially opening the valves than by simultaneously opening all the valves.

The discharge line 3000 may include the second flow rate adjustment valve 3020. The second flow rate adjustment valve 3020 is located between the outlet end of the chamber 1000 and the first opening and closing valve 3025 and an opening ratio thereof is controlled in response to the pressure in the chamber 1000.

The discharge line 3000 includes a first pressure sensor 3010 and a second pressure sensor 3015. The first pressure sensor 3010 measures the pressure in the chamber 1000, and the second pressure sensor 3015 measures the pressure in the chamber 1000 and provides the pressure in the chamber 1000 to the controller to control the first flow rate adjustment valve 2320 and the second flow rate adjustment valve 3020. In some embodiments, the first pressure sensor 3010 and the second pressure sensor 3015 may be connected to the outlet 1000-OL of the chamber 1000 to measure pressures of a gas flow flowing through the outlet 1000-OL. The measured pressures may be used as the pressure in the chamber 1000 to control the first flow rate adjustment valve 2320 and the second flow rate adjustment valve 3020. In some embodiments, the first pressure sensor 3010 may be connected at an upstream of the outlet 1000-OL of the chamber 1000, and the second pressure sensor 3015 may be connected at a downstream of the outlet 1000-OL. For example, the chamber 1000 may be closer to the first pressure sensor 3010 than to the second pressure sensor 3015. The second pressure sensor 3015 may monitor the pressure in the chamber 1000. When the pressure in the chamber 1000 is lower than the reference pressure, the second pressure sensor 3015 may increase an opening ratio of the first flow rate adjustment valve 2320. When the pressure in the chamber 1000 is higher than the reference pressure, the second pressure sensor 3015 may increase an opening ratio of the second flow rate adjustment valve 3020. Therefore, the pressure in the chamber 1000 may be uniformly managed at a desired level.

A filter 3005 may be provided between the outlet end of the chamber 1000 and the first pressure sensor 3010. The filter 3005 filters a foreign substance discharged from the chamber 1000.

The controller is a controller entirely controlling the operation of the pressure adjustment apparatus, and may consist of at least one processing circuit.

Figure 3:
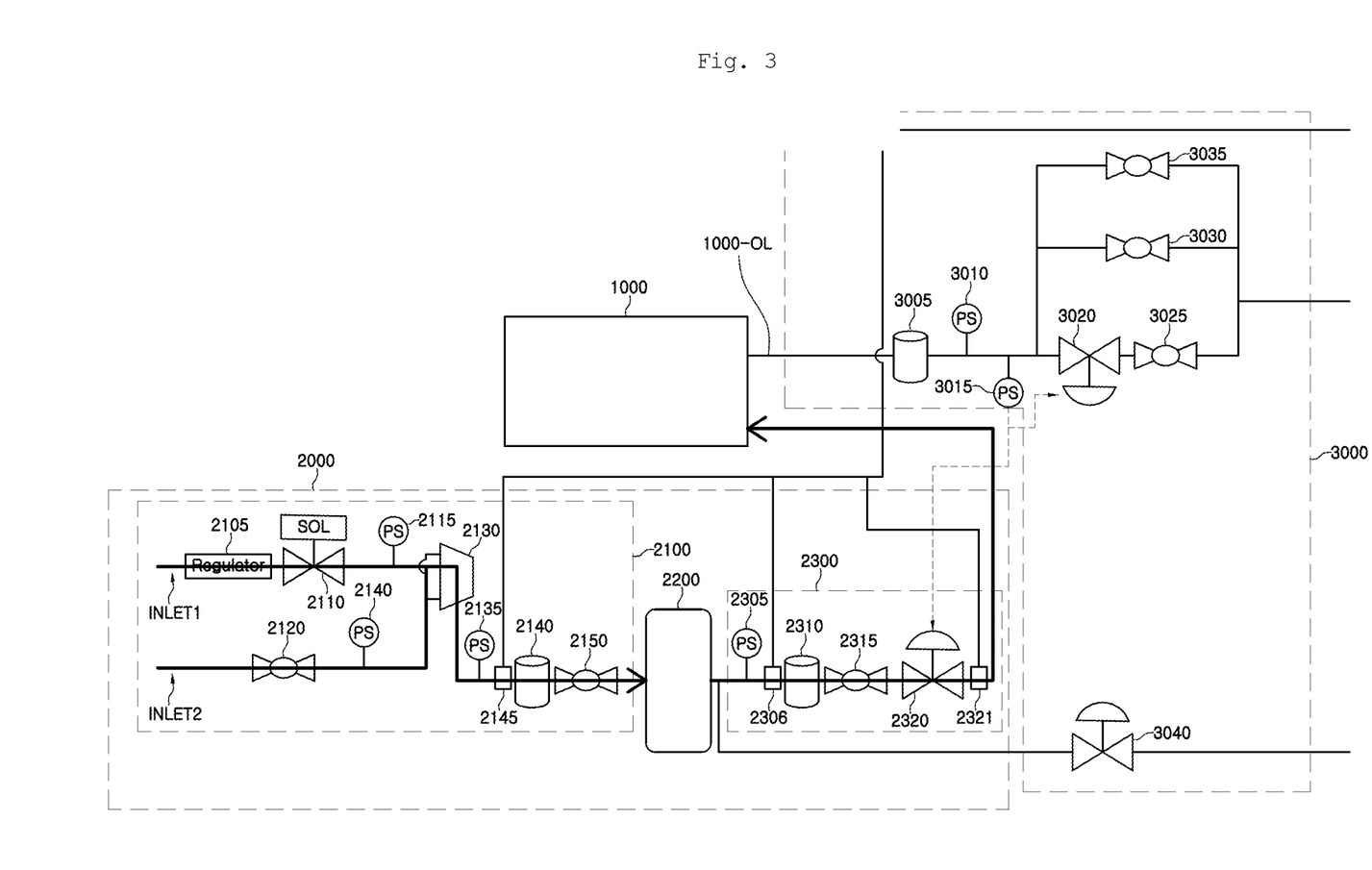
FIG. 3 is a view showing an example of a route for supplying gas to a chamber from the pressure adjustment apparatus.
Figure 4:
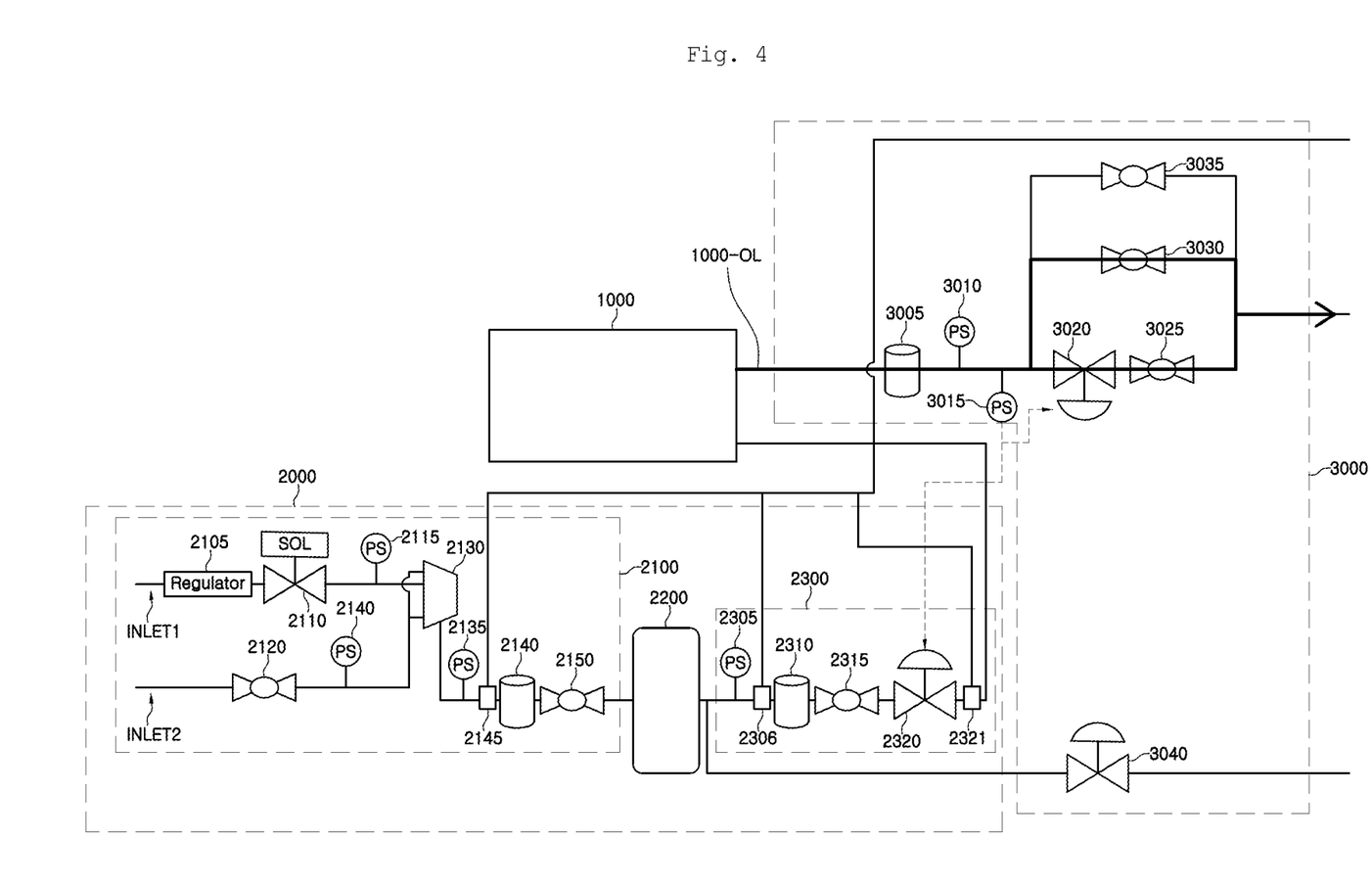
FIGS. 4 and 5 are views showing examples for supplying the gas to the chamber from the pressure adjustment apparatus.
Figure 5:
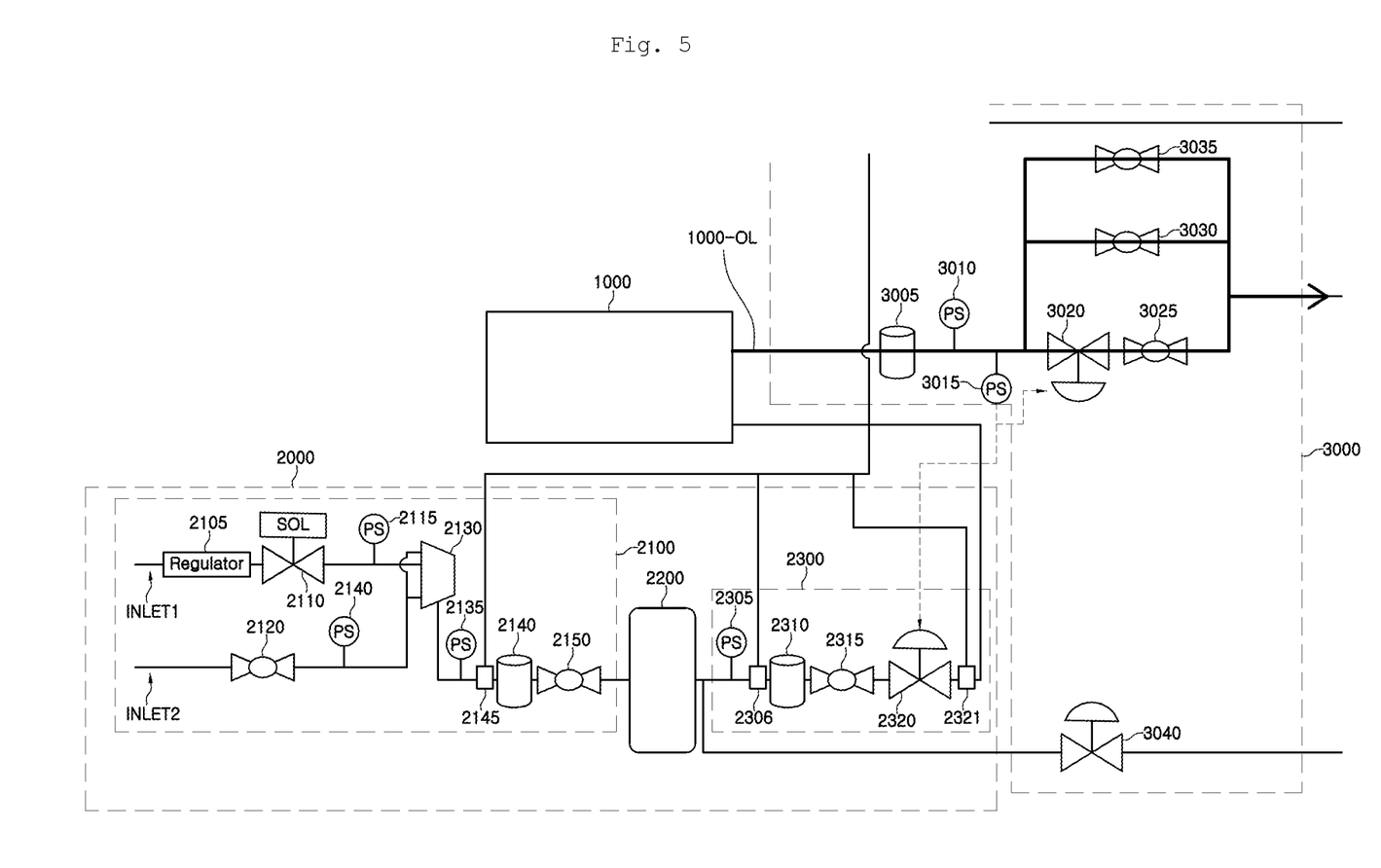

FIG. 3 is a view showing an example of a route for suppling the gas to the chamber from the pressure adjustment apparatus. FIGS. 4 and 5 are views showing examples for supplying the gas to the chamber from the pressure adjustment apparatus.

As shown in FIG. 3, the pressure adjustment apparatus may charge the gas into the storage tank 2200 at higher pressure than the pressure in the chamber 1000. The pressure adjustment apparatus may adjust a flow rate of the gas while monitoring the pressure in the chamber 1000 and rapidly supply the gas into the chamber 1000 to maintain the pressure in the chamber 1000 at the desired level.

As shown in FIGS. 4 and 5, when the process in the chamber 1000 is completed and the gas is discharged from the chamber, the pressure adjustment apparatus opens the first opening and closing valve 3025 and the second opening and closing valve 3030 as shown in FIG. 4. After a predetermined amount of time after opening of the first opening and closing valve 3025 and the second opening and closing valve 3030, as shown in FIG. 5, the pressure adjustment apparatus opens the third opening and closing valve 3035. Therefore, when the gas is discharged from the chamber 1000, an impact generated to the chamber 1000 and lines may be further minimized when the valves are sequentially opened than when all the valves are simultaneously opened.

The pressure adjustment apparatus described above may be provided as a part of a substrate processing apparatus, which will be described below. According to the embodiment of the present disclosure, the substrate processing apparatus includes the chamber 1000, the storage tank 2200, the first supply line 2100, the second supply line 2300, the discharge line 3000, and the controller. The chamber 1000 provides a space in which a processing for a substrate is performed with high pressure gas, the storage tank 2200 stores the gas supplied to the chamber 1000, the first supply line 2100 supplied the gas from the external line to the storage tank 2200, the second supply line 2300 supplies the gas from the storage tank 2200 to the chamber 1000, the discharge line 3000 discharges the gas from the chamber 1000 to the outlet, and the controller controls the valves provided in the first supply line 2100, the second supply line 2300, and the discharge line 3000.

The discharge line 3000 includes the first opening and closing valve 3025, the second opening and closing valve 3030, and the third opening and closing valve 3035. The first opening and closing valve 3025 and the second opening and closing valve 3030 are connected to each other in parallel at the outlet end of the chamber 1000, and the third opening and closing valve 3035 is connected to the outlet end of the chamber 1000. The controller opens the first opening and closing valve 3025 and the second opening and closing valve 3030 when the process in the chamber 1000 is completed. After a predetermined amount of time after opening of the first opening and closing valve 3025 and the second opening and closing valve 3030, the controller opens the third opening and closing valve 3035.

Figure 6:
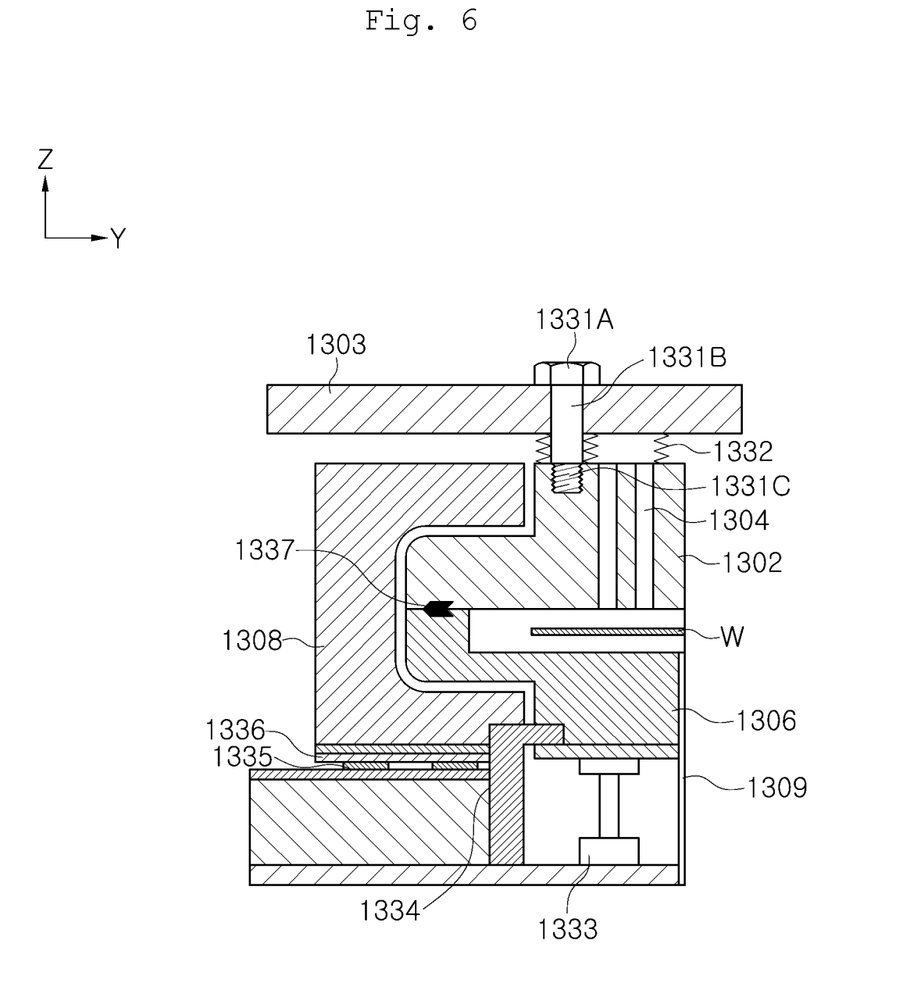
FIGS. 6 and 7 are views showing a section of the chamber in which a substrate is processed in the substrate processing equipment.
Figure 7:
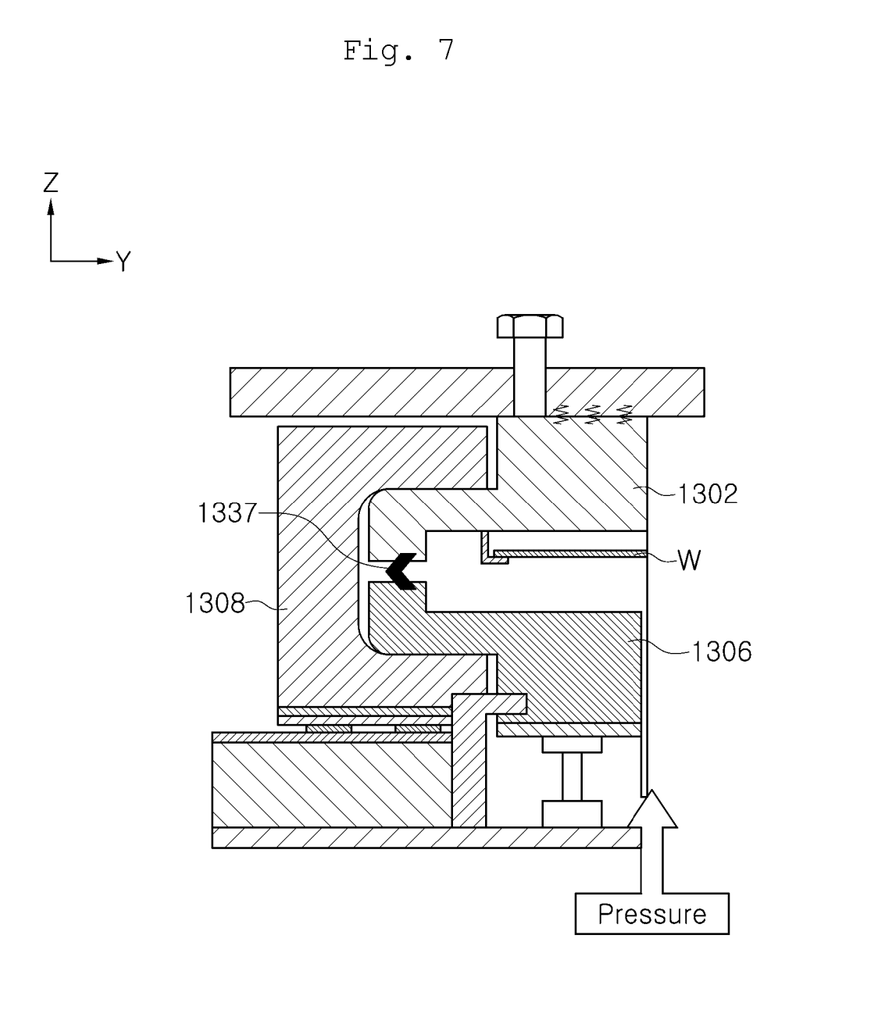

FIGS. 6 and 7 are views showing a section of the chamber in which a substrate is processed in the substrate processing equipment. The bonding equipment bonding the plurality of chips together on the substrate W by using high temperature and high pressure gas may be provided as an example of the substrate processing equipment. The device as shown in FIGS. 6 and 7 may be provided in the chamber 1000 described above.

While the substrate W is loaded, an upper vessel 1302 and a lower vessel 1306 are coupled to each other to provide a processing space. As inert gas (e.g., $N_2$ gas) is supplied into the processing space, the bonding process for the substrate W may be performed. When the substrate W is loaded, the lower vessel 1306 is located at a lower position in the device. The lower vessel 1306 may be raised by a raising and lowering drive part 1333 after loading of the substrate W. The raising and lowering drive part 1333 may be realized by a cylinder, and a stopper 1334 may be provided for the raising and lowering drive part 1333 in order to limit a raising height. The stopper 1334 may limit the maximum height to which the lower vessel 1306 may be raised, whereby a spacing between the lower vessel 1306 and a clamping member 1308 may be maintained constant.

After raising of the lower vessel 1306, the clamping member 1308 may be moved from a fixation releasing location to a coupling location by a moving object (linear actuator) 1335 moving along a horizontal guide (LM guide) 1336. The upper vessel 1302 and the lower vessel 1306 may be clamped as the clamping member 1308 is moved.

An upper plate 1303 and the upper vessel 1302 may be coupled to each other by a fastening member (shoulder bolt) 1331. An elastic body 1332 (e.g., spring) may be provided between the upper plate 1303 and the upper vessel 1302. The shoulder bolt 1331 has a flange portion 1331A at an upper portion thereof, and a coupling portion 1331C at a lower portion thereof. A bolt rod portion 1331B may be formed between the flange portion and the coupling portion. The flange portion 1331A of the shoulder bolt 1331 is blocked to an upper surface of the upper plate 1303, and the coupling portion 1331C of the shoulder bolt 1331 is fastened to a fastening hole of the upper vessel 1302. The upper vessel 1302 may be located while being spaced apart from the upper plate 1303 at a predetermined interval by the bolt rod portion 1331B of the shoulder bolt 1331. As a location of the upper vessel 1302 is set by the shoulder bolt 1331, a spacing between the upper vessel 1302 and the clamping member 1308 may be maintained.

As the gas is injected into the processing space of the substrate W to increase the pressure, the upper vessel 1302 and the lower vessel 1306 are pushed by the pressure therein. The elasticity of the elastic body 1332 coupled to the upper vessel 1302 and the upper plate 1303 at a portion therebetween presses downward the upper vessel 1302 that is pushed upward by the internal pressure, so that it is possible to prevent the upper vessel 1302 from being sharply pushed upward. When the pressure in the processing space increases, the fastening member 1331 may be raised with the upper vessel 1302 and the elastic body 1332 may apply the elasticity to the upper vessel 1302 to provide a damping force.

When the pressure in the processing space is higher than the damping force of the elastic body 1332 as the process increases for processing the substrate W, the upper vessel 1302 may be pushed upward to be brought into contact with the clamping member 1308.

The raising and lowering drive part 1333 coupled to the lower vessel 1306 presses upward the lower vessel 1306 pushed downward by the pressure in the processing space, so that it is possible to prevent the lower vessel 1306 from being sharply pushed downward. When the pressure in the processing space is higher than the damping force of the raising and lowering drive part 1333 as the process increases for processing the substrate W, the lower vessel 1306 may be pushed downward to be brought into contact with the clamping member 1308.

A sealing member 1337 may be coupled to circumferential portions of the upper vessel 1302 and the lower vessel 1306 to prevent gas leakage occurring between the upper vessel 1302 and the lower vessel 1306 by the internal pressure. The sealing member 1337 may be formed of Teflon™ (PTFE) material with high heat resistance. The sealing member 1337 may be realized in a shape of which a center portion is projected outward in comparison to upper and lower ends thereof. A resistance of the sealing member 1337 may prevents the gas from leaking outward.

As correlation of each force when pressing is performed for processing the substrate W in the processing space, it is configured to have a large force in order of the pressure in the processing space generated by the gas—the lower damping force generated by the raising and lowering drive part 1333—the upper damping force generated by the elastic body 1332—the resistance force of the sealing member 1337. When the pressure is reduced after processing the substrate W, the lower damping force generated by the raising and lowering drive part 1333 and the upper damping force generated by the elastic body 1332 are larger than the resistance force of the sealing member 1337, whereby the spacing between the upper vessel 1302 and the clamping member 1308 and the spacing between the lower vessel 1306 and the clamping member 1308 may be maintained.

As shown in FIG. 6, the lower vessel 2306 may have an air pressure adjustment part 1309. The air pressure adjustment part 1309 may be provided in the lower vessel 1306 to inject the inert gas into the processing space or to discharge the inert gas therefrom. For example, the air pressure adjustment part 1309 may include an injection conduit for injecting the inert gas into the processing space and a discharge conduit for discharging the inert gas from the processing space. A plate may be provided at an upper portion of the air pressure adjustment part 1309 as an air current inducing part provided to induce an air current sideways. The air current inducing part may prevent a damage caused to the substrate W when the gas directly hits the substrate W. A temperature adjustment part 1304 may be provided in the upper vessel 1302 to increase or reduce the temperature in the processing space.

FIG. 7 is a view showing an example of high pressure environment generated in the bonding device for the plurality of chips according to the embodiment of the present disclosure. As described above, when the pressure in the processing space is higher than the damping force of the elastic body 1332 as the gas is injected into the processing space and the process increases for processing the substrate W, the upper vessel 1302 may be pushed upward to be brought into contact with the clamping member 1308. When the pressure in the processing space is higher than the damping force of the raising and lowering drive part 1333 as the process increases, the lower vessel 1306 may be pushed downward to be brought into contact with the clamping member 1308.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A substrate processing apparatus comprising:
a chamber;
a storage tank configured to store a gas to be supplied to the chamber;
a first supply line configured to supply the gas from an external line to the storage tank;
a second supply line connecting the storage tank to the chamber and configured to supply the gas from the storage tank to the chamber, wherein the second supply line comprises a first flow rate adjustment valve;
a discharge line connected to an outlet of the chamber and configured to discharge the gas from the chamber via the outlet of the chamber,
wherein the discharge line comprises:
a first valve and a second valve connected to each other in parallel at an end portion of the outlet of the chamber;
a third valve connected to the end portion of the outlet of the chamber;
a second flow rate adjustment valve located between the end portion of the outlet of the chamber and the first valve, wherein the second flow rate adjustment valve and the first valve are connected with each other in series, and the second flow rate adjustment valve is connected with the third and second valves in parallel;
a first pressure sensor configured to measure an upstream pressure of the outlet of the chamber;
a second pressure sensor configured to measure a downstream pressure of the outlet of the chamber,
wherein the first pressure sensor and the second pressure sensor are disposed between the outlet of the chamber and the second flow rate adjustment valve,
wherein the chamber is closer to the first pressure sensor than to the second pressure sensor; and
a controller configured to:
open the first valve and the second valve to discharge the gas from the chamber,
open the third valve after a predetermined time after opening of the first valve and the second valve,
receive the upstream pressure and the downstream pressure from the first pressure sensor and the second pressure sensor, respectively, and
control the first flow rate adjustment valve based on the upstream pressure and the downstream pressure such that a ratio of a first time during which the first flow rate adjustment valve is open and a second time during which the first flow rate adjustment valve is closed is controlled.

2. The substrate processing apparatus of claim 1,
wherein the first supply line comprises:
a first inlet receiving a first flow of the gas at a first pressure;
a second inlet provided as a separate line from the first inlet and receiving a second flow of the gas at a second pressure; and a booster configured to amplify the first flow of the gas and the second flow of the gas flowing through the first inlet and the second inlet, respectively, to a predetermined pressure greater than the first pressure and the second pressure prior to supplying the gas to the storage tank.

3. The substrate processing apparatus of claim 2, wherein the booster is configured to:

output the second flow of the gas flowing through the second inlet to a third pressure, higher than the first pressure, by using a pressure of the first flow of the gas flowing through the first inlet for a first time section; and output the first flow of the gas flowing through the first inlet to a fourth pressure, higher than the second pressure, by using a pressure of the second flow of the gas flowing through the second inlet for a second time section.

4. The substrate processing apparatus of claim 1, wherein the storage tank is configured to store the gas at a pressure higher than the pressure in the chamber.

5. The substrate processing apparatus of claim 1, wherein the controller is configured further to control the second flow rate adjustment valve based on the upstream pressure and the downstream pressure to control a ratio of a third time during which the second flow rate adjustment valve is open and a fourth time during which the second flow rate adjustment valve is closed.

* * * * *